(12) United States Patent
Kim et al.

(10) Patent No.: US 7,871,875 B2
(45) Date of Patent: Jan. 18, 2011

(54) FIN FIELD EFFECT TRANSISTOR AND METHOD OF MANUFACTURING THE SAME

(75) Inventors: Sung-Min Kim, Incheon (KR); Min-Sang Kim, Seoul (KR); Ji-Myoung Lee, Yongin-si (KR); Dong-Won Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/662,083

(22) Filed: Mar. 30, 2010

(65) Prior Publication Data

US 2010/0197094 A1    Aug. 5, 2010

Related U.S. Application Data

(62) Division of application No. 12/230,571, filed on Sep. 2, 2008, now Pat. No. 7,723,797.

(30) Foreign Application Priority Data

Aug. 31, 2007    (KR) .................. 10-2007-0088162

(51) Int. Cl.
    *H01L 21/336*    (2006.01)
    *H01L 21/8234*    (2006.01)
(52) U.S. Cl. ............... 438/197; 438/268; 257/E21.421
(58) Field of Classification Search ............... 438/156, 438/197, 198, 268, 275; 257/E21.421
    See application file for complete search history.

(56) References Cited

U.S. PATENT DOCUMENTS 6,888,181 B1    5/2005  Liao et al.
7,479,421 B2 *  1/2009  Kavalieros et al. .......... 438/197
2005/0199948 A1  9/2005  Lee et al.
2006/0071275 A1  4/2006  Brask et al.
2006/0160302 A1  4/2006  Kim et al.
2006/0172497 A1  8/2006  Hareland et al.
2006/0284249 A1  12/2006 Chen et al.
2007/0026615 A1  2/2007  Goktepeli et al.
2008/0265321 A1  10/2008 Yu et al.

FOREIGN PATENT DOCUMENTS

JP    2005-086024    3/2005
KR    678456         1/2007

* cited by examiner

*Primary Examiner*—Hoai v Pham
(74) *Attorney, Agent, or Firm*—Harness, Dickey & Pierce, P.L.C.

(57) ABSTRACT

Provided are a FinFET and a method of manufacturing the same. A FinFET may include at least one active fin, at least one gate insulating layer pattern, a first electrode pattern, a second electrode pattern and at least one pair of source/drain expansion regions. The at least one active fin may be formed on a substrate. The at least one gate insulating layer pattern may be formed on the at least one active fin. The first electrode pattern may be formed on the at least one gate insulating layer pattern. Further, the first electrode pattern may be intersected with the at least one active fin. The second electrode pattern may be formed on the first electrode pattern. Further, the second electrode pattern may have a width greater than that of the first electrode pattern. The at least one pair of source/drain expansion regions may be formed on a surface of the at least one active fin on both sides of the first electrode pattern. Thus, the FinFET may have improved capacity and reduced GIDL current.

16 Claims, 10 Drawing Sheets

FIN FIELD EFFECT TRANSISTOR AND METHOD OF MANUFACTURING THE SAME

PRIORITY STATEMENT

This application is a divisional application of U.S. Ser. No. 12/230,571, filed on Sep. 2, 2008, now U.S. Pat. No. 7,723,797 which claims priority under 35 U.S.C. §119 to Korean Patent Application No. 2007-88162, filed on Aug. 31, 2007, in the Korean Intellectual Property Office (KIPO), the entire contents of which are herein incorporated by reference.

BACKGROUND

1. Field

Example embodiments relate to a field effect transistor, and a method of manufacturing the same. Other example embodiments relate to a fin field effect transistor (FinFET), and a method of manufacturing the FinFET.

2. Description of the Related Art

In order to provide semiconductor devices with a more rapid operational speed and increased integration degree, a channel length of a MOS field effect transistor (MOSFET) has been gradually reduced. However, in a planar MOSFET, an electrical field may affect the planar MOSFET by a drain voltage because the channel length may become shorter. Further, this may cause a short channel effect where a channel drive capacity may be deteriorated due to a gate electrode. To control a threshold voltage of the planar MOSFET, increasing an impurity concentration of a channel may be required. However, this may cause relatively low mobility of carriers and a relatively low current drive force. Therefore, in the planar MOSFET, suppressing the short channel effect may be difficult because the planar MOSFET may have a more rapid operational speed and an increased integration degree.

A type of transistors, which have a structure capable of reducing the short channel effect, may include a fin field effect transistor (FinFET). The FinFET may include an active region having a three-dimensional fin shape. The fin may be surrounded by a gate electrode. Thus, a three-dimensional channel may be formed along a surface of the fin. Because the channel is formed on an upper surface and sidewalls of the fin, the FinFET may have a larger effect channel width in a relatively small horizontal area. Thus, a semiconductor device having the FinFET may have a relatively small size and a more rapid operational speed. Further, the short channel effect may be reduced owing to a reduced capacitance of the drain region. In order to improve operational characteristics of the FinFET, uniformly forming source/drain regions on a surface of the three-dimensional fin may be necessary. However, because a body width of the fin is gradually narrowed and the fin has the three-dimensional shape, the surface of the fin may not be readily doped with impurities.

Further, the FinFET may have a gate induced drain leakage (GIDL) current higher than that of the planar MOSFET. This may be caused by the three-dimensional shape of the fin that may provide a relatively large overlapped area between the gate electrode and the drain region. To decrease the GIDL current, minimizing or reducing the overlapped area between the source/drain regions and the gate electrode may be required. However, a process for forming the source/drain regions may include doping impurities, and activating the impurities by a thermal treatment. The thermal treatment may cause a horizontal and vertical diffusion of the impurities. The diffusion of the impurities may cause a continuous increase of the overlapped area between the source/drain regions and the gate electrode. As a result, the GIDL current may not be sufficiently reduced.

In a conventional method of reducing the GIDL current, after forming the gate electrode, an offset spacer may be formed on a sidewall of the gate electrode to reduce the overlapped area between the source/drain regions and the gate electrode. However, the offset spacer may be formed on a sidewall of the fin to be doped with the impurities as well as the sidewall of the gate electrode. Thus, the impurities in the sidewall of the fin, where the offset spacer is formed, may be different from those in the upper surface of the fin where the offset spacer may not be formed. Further, a higher energy to dope the sidewall of the fin with the impurities through the offset spacer may be required which causes damages to the surface of the fin.

SUMMARY

Example embodiments provide a fin field effect transistor (FinFET) that is capable of reducing a gate induced drain leakage (GIDL) current with increased capacity. Example embodiments also provide a method of manufacturing the above-mentioned FinFET.

According to example embodiments, a FinFET may include at least one active fin, at least one gate insulating layer, pattern, a first electrode pattern, a second electrode pattern and at least one pair of source/drain expansion regions. The at least one active fin may be formed on a substrate. The at least one gate insulating layer pattern may be formed on the at least one active fin. The first electrode pattern may be formed on the at least one gate insulating layer pattern. Further, the first electrode pattern may be intersected with the at least one active fin. The second electrode pattern may be formed on the first electrode pattern. Further, the second electrode pattern may have a width greater than that of the first electrode pattern. The at least one pair of source/drain expansion regions may be formed on a surface of the active fin on both sides of the first electrode pattern.

According to example embodiments, the first electrode pattern and the second electrode pattern may have materials having different etching selectivities. The first electrode pattern may include polysilicon germanium. The second electrode may include polysilicon. The first electrode pattern and the second electrode pattern may be doped with impurities having a conductive type substantially the same as that of impurities in the source/drain expansion regions. Alternatively, the first electrode pattern may include titanium, titanium nitride, tantalum and/or tantalum nitride. The second electrode pattern may include polysilicon.

According to example embodiments, the first electrode pattern may have a thickness of about 100 Å to about 400 Å. According to example embodiments, the FinFET may further include spacers on sidewalls of the first electrode pattern and a second electrode pattern, and source/drain regions in a surface of the active fin on both sides of each of the spacers. The source/drain regions may have an impurity concentration higher than that of the at least one pair of source/drain expansion regions.

According to example embodiments, the FinFET may further include an isolation layer pattern on the substrate on both sides of the at least one active pin. According to example embodiments, the at least one source/drain expansion region may be overlapped with an end of the first electrode pattern. According to example embodiments, the substrate may include a single crystalline silicon substrate, a silicon-oninsulator (SOI) substrate, a silicon germanium-on-insulator (SGOI) substrate, or a germanium-on-insulator (GOI) substrate.

According to example embodiments, the at least one active fin may include first and second active fins in an NMOS region and a PMOS region of the substrate, respectively, the at least one gate insulating layer pattern may include first and second gate insulating layer patterns on a surface of the first and second active fins, respectively, the at least one pair of source/drain expansion regions may include first and second source/drain expansion regions, and the FinFET may include the first source/drain expansion region in the surface of the first active fin on both sides of the first electrode pattern, the first source/drain expansion regions doped with n-type impurities, a third electrode pattern on the second gate insulating layer pattern, the third electrode pattern being intersected with the second active fin, a fourth electrode pattern on the third electrode pattern, the fourth electrode pattern having a width greater than that of the third electrode pattern, and the second source/drain expansion regions in the surface of the second active fin on both sides of the third electrode pattern, the second, source/drain expansion regions doped with p-type impurities.

Furthermore, the third electrode pattern may include a material substantially the same as that of the first electrode pattern. The fourth electrode pattern may be formed on the third electrode pattern. Further, the fourth electrode pattern may have a width greater than that of the third electrode pattern. The second source/drain expansion regions may be formed in a surface of the second active fin on both sides of the third electrode pattern. Further, the second source/drain regions may be doped with p-type impurities.

According to example embodiments, the first electrode pattern and the second electrode pattern may have different work functions. The first electrode pattern may include polysilicon germanium doped with n-type impurities. The third electrode pattern may include polysilicon germanium doped with p-type impurities. Alternatively, the first electrode pattern and the second electrode pattern may have substantially the same work function of about 4.0 eV to about 5.2 eV. The first electrode pattern and the third electrode pattern may include titanium, titanium nitride, tantalum and/or tantalum nitride.

In a method of manufacturing a FinFET in accordance with example embodiments, an active fin may be formed on a substrate. A gate insulating layer pattern may be formed on the active fin. A first electrode layer and a second electrode layer may be sequentially formed on the gate insulating layer pattern. The first electrode layer and the second electrode layer may be patterned to form a first preliminary electrode pattern and a second electrode pattern. The first preliminary electrode pattern may be intersected with the active fin. Impurities may be implanted into a surface of the active fin on both sides of the first preliminary electrode pattern and the second electrode pattern to form source/drain expansion regions. A sidewall of the first preliminary electrode pattern may be partially removed to form a first electrode pattern having a width less than that of the second electrode pattern.

According to example embodiments, the first electrode layer and the second electrode layer may have materials having different etching selectivities. The first electrode layer may include polysilicon germanium. The second electrode layer may include polysilicon. In example embodiments, patterning the first electrode layer and the second electrode layer may include forming a mask pattern on the second electrode pattern, dry-etching the second electrode layer using the mask pattern as an etch mask to form the second electrode pattern, and wet-etching the first electrode layer under the second electrode pattern to form the first preliminary electrode pattern.

The first electrode layer may be wet-etched using an etching solution that may include nitric acid, fluoric acid, acetic acid and deionized water. According to example embodiments, partially removing the sidewall of the first preliminary electrode pattern may include a wet etching process using an etching solution. The etching solution may include ammonium hydroxide, hydrogen peroxide and deionized water. Alternatively, the etching solution may include nitric acid, fluoric acid, acetic acid and deionized water. Alternatively, the first electrode layer may include titanium, titanium nitride, tantalum and/or tantalum nitride. The second electrode layer may include polysilicon.

According to example embodiments, forming the first electrode pattern may include partially etching the first preliminary electrode pattern to overlap the first electrode pattern with an end of the source/drain expansion regions. According to example embodiments, forming the source/drain expansion regions may include a plasma ion implantation process and/or a tilt-angle ion implantation process. According to example embodiments, the method may further include forming spacers on sidewalls of the first electrode pattern and a second electrode pattern, and doping a surface of the active fin on both sides of each of the spacers with impurities to form source/drain regions. Forming the source/drain regions may include a plasma ion implantation process and/or a tilt-angle ion implantation process.

In a method of manufacturing a FinFET in accordance with example embodiments, an active fin protruded from a substrate may be formed. A gate insulating layer pattern may be formed on a surface of the active fin. A first electrode layer and a second electrode layer may be sequentially formed on the gate insulating layer pattern. The second electrode layer may be patterned to form a second electrode pattern, the second electrode pattern being intersected with the active fin. The first electrode layer exposed by the second electrode pattern may be etched to form a first preliminary electrode pattern. A sidewall of the first preliminary electrode pattern may be partially etched to form a first electrode pattern having a width less than that of the second electrode pattern. The surface of the active fin exposed by the first electrode pattern and the second electrode pattern may be doped to form source/drain expansion regions.

According to example embodiments, the first preliminary electrode pattern and the first electrode pattern may be formed by a wet etching process. According to example embodiments, the method may further include partially removing the sidewall of the first electrode pattern to reduce an overlapped area between the first electrode pattern and the source/drain expansion regions.

In a method of manufacturing a FinFET in accordance with example embodiments, a first active pin may be formed in an NMOS region of a substrate. A second active pin may be formed in a PMOS region of the substrate. A first gate insulating layer pattern may be formed on the first active fin. A second oxide layer pattern may be formed on the second active fin. A first electrode layer may be formed on the first gate insulating layer pattern. A second electrode layer may be formed on the first electrode pattern. The first electrode layer and the second electrode layer may be patterned to form a first preliminary electrode pattern, a second electrode pattern, a third preliminary electrode pattern and a fourth electrode pattern. The first preliminary electrode pattern may be intersected with the first active fin. The third preliminary electrode pattern may be intersected with the second active fin. N-type impurities may be implanted into a surface of the first active fin on both sides of the first preliminary electrode pattern and the second electrode pattern. P-type impurities may be implanted into a surface of the second active fin on both sides of the third preliminary electrode pattern and the fourth electrode pattern. Sidewalls of the first preliminary electrode pattern and the third preliminary electrode pattern may be partially removed to form a first electrode pattern and a third electrode pattern.

According to example embodiments, the FinFET may have the source/drain expansion regions having a uniform doping concentration in the surface of the active fin. Thus, the FinFET may have improved capacity. Further, the source/drain expansion regions may not excessively infiltrate into an edge of the first electrode pattern. Therefore, the areas of the gate electrode and the source/drain expansion regions may not overlap with each other much, so that the GIDL current may be reduced.

BRIEF DESCRIPTION OF THE DRAWINGS

Example embodiments will be more clearly understood from the following detailed description taken in conjunction with the accompanying drawings.

FIG. 1 is a perspective view illustrating a FinFET in accordance with example embodiments;

FIG. 2 is a cross-sectional view take along a line I-I' in FIG. 1;

FIGS. 3 to 13 are perspective views and cross-sectional views illustrating a method of manufacturing the FinFET in FIGS. 1 and 2 in accordance with example embodiments;

FIGS. 14 to 16 are perspective views and cross-sectional views illustrating a method of manufacturing the FinFET in FIGS. 1 and 2 in accordance with example embodiments; and FIG. 17 is a perspective view illustrating a CMOS FinFET in accordance with example embodiments.

Figure 1:
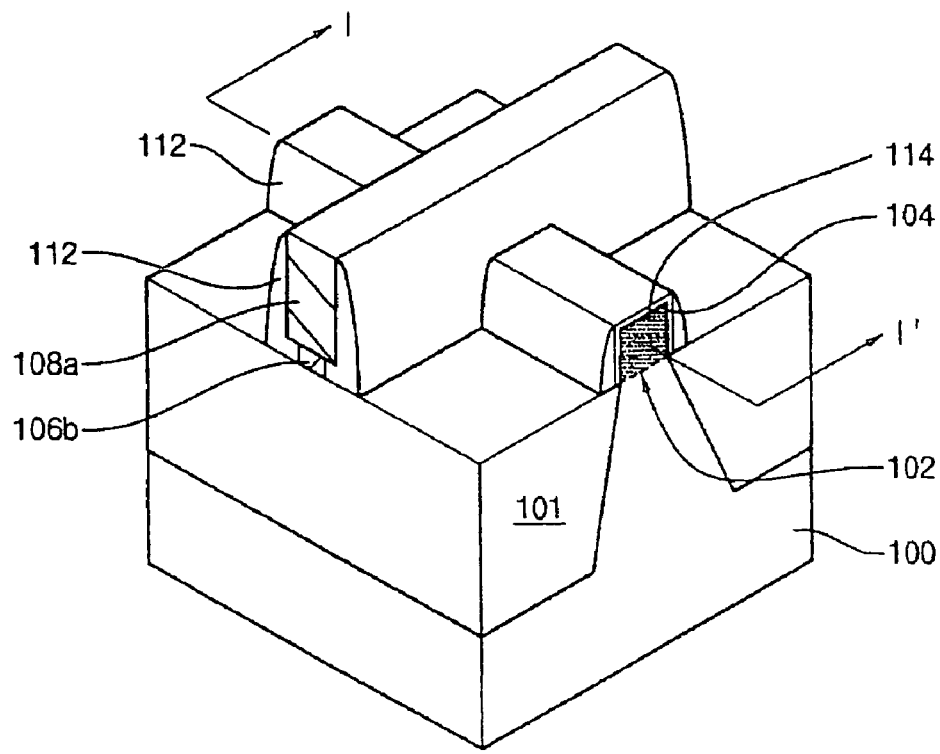
FIGS. 1-17 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments are described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, some example embodiments will be explained in detail with reference to the accompanying drawings.

Figure 2:
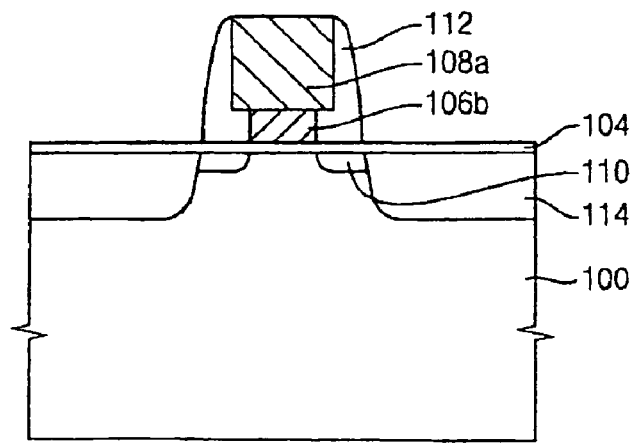

FIG. 1 is a perspective view illustrating a FinFET in accordance with example embodiments, and FIG. 2 is a cross-sectional view take along a line I-I' in FIG. 1. Referring to FIGS. 1 and 2, an active fin 102 may be formed on a semiconductor substrate 100. The semiconductor substrate 100 may include a single crystalline silicon substrate, a silicon-on-insulator (SOI) substrate, a silicon germanium-on-insulator (SGOI) substrate and/or a germanium-on-insulator (GOI) substrate. In example embodiments, the semiconductor substrate 100 may include the single crystalline silicon substrate. The active fin 102 may have a shape extending in a first direction. In example embodiments, the active fin 102 may include single crystalline silicon.

Isolation layer patterns 101 may be arranged on both sides of the active fin 102. The active fin 102 may have an upper surface higher than that of the isolation layer patterns 101. Thus, the active fin 102 may be protruded from the upper surface of the isolation layer patterns 101. In example embodiments, the protruded height of the active fin 102 from the isolation layer patterns 101 may be less than a width of the upper surface of the active fin 102, e.g., a width of a fin body in the active fin 102. Alternatively, as shown in the drawings, the protruded height of the active fin 102 from the isolation layer patterns 101 may be substantially the same as the width of the upper surface of the active fin 102.

A gate insulating layer pattern 104 may be formed on the upper surface of the active fin 102. In example embodiments, the gate insulating layer pattern 104 may be formed by a thermal oxidation process using silicon oxide. A first electrode pattern 106b may be formed on the gate insulating layer pattern 104. The first electrode pattern 106b may be intersected with the active fin 102. The first electrode pattern 106b may serve as a gate electrode of the FinFET. Thus, a threshold voltage of the FinFET may vary in accordance with a work function of the first electrode pattern 106b.

Therefore, the first electrode pattern 106b may include a material suitable for a gate electrode of an N type transistor or a P type transistor. For example, the first electrode pattern 106b may include a conductive material having a work function that may be controlled by doping impurities. Alternatively, the first electrode pattern 106b may include a conductive material having a mid-gap work function that may be a middle value of work functions of the gate electrodes of the N type transistor and the P type transistor. In example embodiments, the mid-gap work function may include a work function of about 4.0 eV to about 5.2 eV.

For example, the first electrode pattern 106b may include polysilicon germanium. The polysilicon germanium may be doped with impurities having a conductive type substantially the same as that of impurities in source/drain regions. When the FinFET is P type, the polysilicon germanium may be doped with p-type impurities, e.g., boron. In contrast, when the FinFET is N type, the polysilicon germanium may be doped with n-type impurities, e.g., arsenic and/or phosphorous.

Alternatively, the first electrode pattern 106b may include titanium, titanium nitride, tantalum and/or tantalum nitride. These may be used alone or in a combination thereof. The above-mentioned metals may have the mid-gap work function so that the metal may be used for the gate electrodes of the N type transistor and the P type transistor. When the first electrode pattern 106b has a thickness of below about 100 Å, the first electrode pattern 106b may not sufficiently function as the gate electrode. In contrast, when the first electrode pattern 106b has a thickness of above about 400 Å, an etching process may not be readily controlled. Thus, the first electrode pattern 106b may have a thickness of about 100 Å to about 400 Å, for example, about 300 Å.

A second electrode pattern 108a may be formed on the first electrode pattern 106b. In example embodiments, the second electrode pattern 108a may have a width greater than that of the first electrode pattern 106b. For example, a structure including the first electrode pattern 106b and the second electrode pattern 108a sequentially stacked may have a "T" shape. Thus, the second electrode pattern 108a may have a shape configured to fully cover an upper surface of the first electrode pattern 106b.

The second electrode pattern 108a may function so as to reduce a resistance of the gate electrode. For example, when the gate electrode includes only the first electrode pattern 106b, the gate electrode may have a relatively high resistance because the first electrode pattern 106b may have be relatively thin, e.g., about 100 Å to about 400 Å. Thus, the gate electrode may have a reduced resistance by stacking the second electrode pattern 108a on the first electrode pattern 106b.

In example embodiments, the second electrode pattern 108a may include a material having an etching selectivity with respect to a material of the first electrode pattern 106b. For example, the second electrode pattern 108a may include a material that may not be etched much in a process for etching the first electrode pattern 106b. Further, the second electrode pattern 108a may include a material having relatively strong adhesion strength with respect to the first electrode pattern 106b. Furthermore, the second electrode pattern 108a may include a material that may be readily etched using an etching gas.

For example, the second electrode pattern 108a may include polysilicon. Further, the polysilicon may be doped with impurities having a conductive type substantially the same as that of the impurities in the source/drain regions. Alternatively, the second electrode pattern 108a may include a metal, e.g., tungsten. Further, although not depicted in the drawings, the second electrode pattern 108a may have a structure where a polysilicon layer pattern and a metal pattern or a metal silicide layer pattern may be sequentially stacked.

Source/drain expansion regions 110 may be formed in a surface of the semiconductor substrate 100 under the surface of the active fin 102 on both sides of the first electrode pattern 106b. In example embodiments, the source/drain expansion regions 110 may have an end partially overlapped with both ends of the first electrode pattern 106b. Alternatively, the end of each of the source/drain expansion regions 110 may make contact with both ends of the first electrode pattern 106b. However, the width of the first electrode pattern 106b may be less than that of the second electrode pattern 108a, and an overlapped area between the first electrode pattern 106b and the source/drain expansion regions 110 may be reduced. Thus, a gate induced drain leakage (GIDL) current, which may be generated by a relatively large overlapped area between the first electrode pattern 106b and the source/drain expansion regions 110, may be decreased.

Spacers 112 may be formed on sidewalls of the first electrode pattern 106b and the second electrode pattern 108a. In example embodiments, the spacers 112 may include silicon nitride. Source/drain regions 114 may be formed in the surface of the semiconductor substrate 100 under the active fin 102 on both sides of the spacers 112. The source/drain regions 114 may have an impurity concentration higher than that of the source/drain expansion regions 110.

Figure 3:
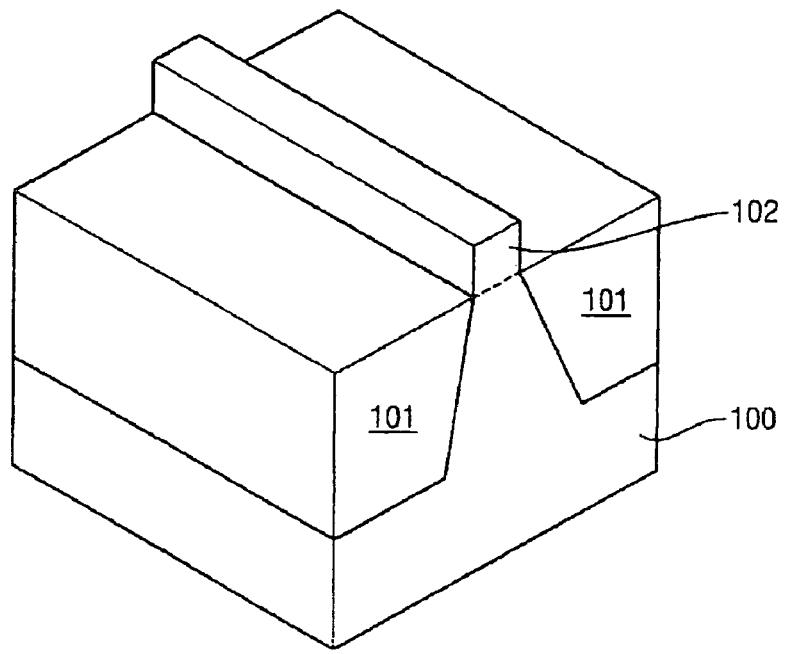

FIGS. 3 to 13 are perspective views and cross-sectional views illustrating a method of manufacturing the FinFET in FIGS. 1 and 2 in accordance with example embodiments. Referring to FIG. 3, a semiconductor substrate 100 including single crystalline silicon may be processed to form an active fin 102 protruded from an upper surface of isolation layer patterns 101. Hereinafter, a process for forming the active fin 102 may be illustrated in detail. An etch mask pattern (not shown) may be formed the semiconductor substrate 100 to selectively cover a region of the semiconductor substrate 100 where the active fin 102 may be formed. The semiconductor substrate 100, except for the region, may be etched using the etch mask pattern to form isolation trenches (not shown). An insulating layer (not shown) may be formed on the semiconductor substrate 100 to fill the trenches. The insulating layer may be planarized until an upper surface of the etch mask pattern may be exposed to form preliminary isolation layers in the trenches.

Upper portions of the preliminary isolation layers may be partially etched to form the isolation layer patterns 101. By performing the above-mentioned process, side faces of the trenches may be exposed to form the active fin 102 protruding from the isolation layer patterns 101. In example embodiments, the preliminary isolation layer may be removed by a wet etching process. The etch mask pattern may then be removed to expose an upper surface of the active fin 102.

Figure 4:
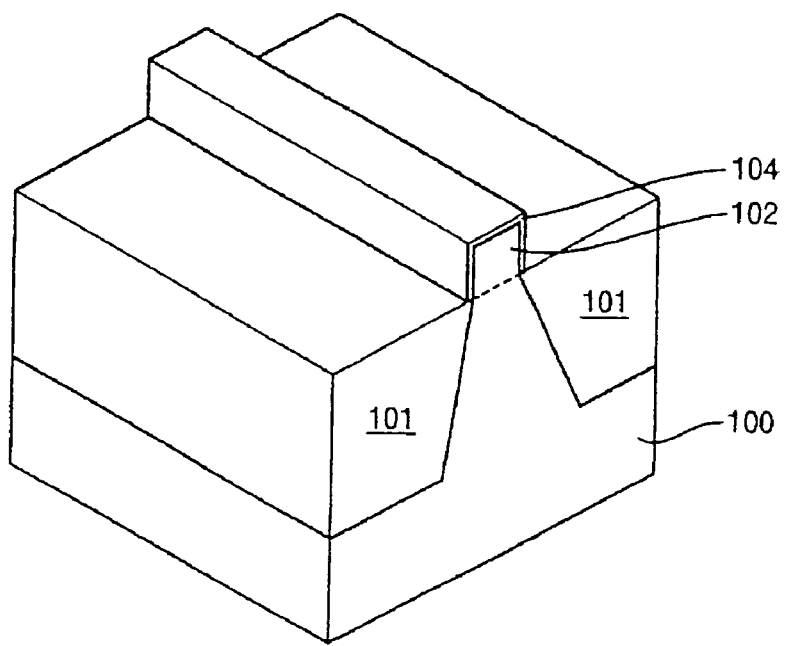

Alternatively, the semiconductor substrate 100 may include a silicon-on-insulator (SOI) substrate, a silicon germanium-on-insulator (SGOI) substrate and/or a germanium-on-insulator (GOI) substrate. In example embodiments, the active fin 102 may be formed by a simple patterning process. Referring to FIG. 4, a gate insulating layer pattern 104 may be formed on a surface of the active fin 102. In example embodiments, the surface of the active fin 102 may be thermally oxidized to form the gate insulating layer pattern 104 including silicon oxide. A thickness of the gate insulating layer pattern 104 may vary in accordance with characteristics of a desired transistor.

Figure 5:
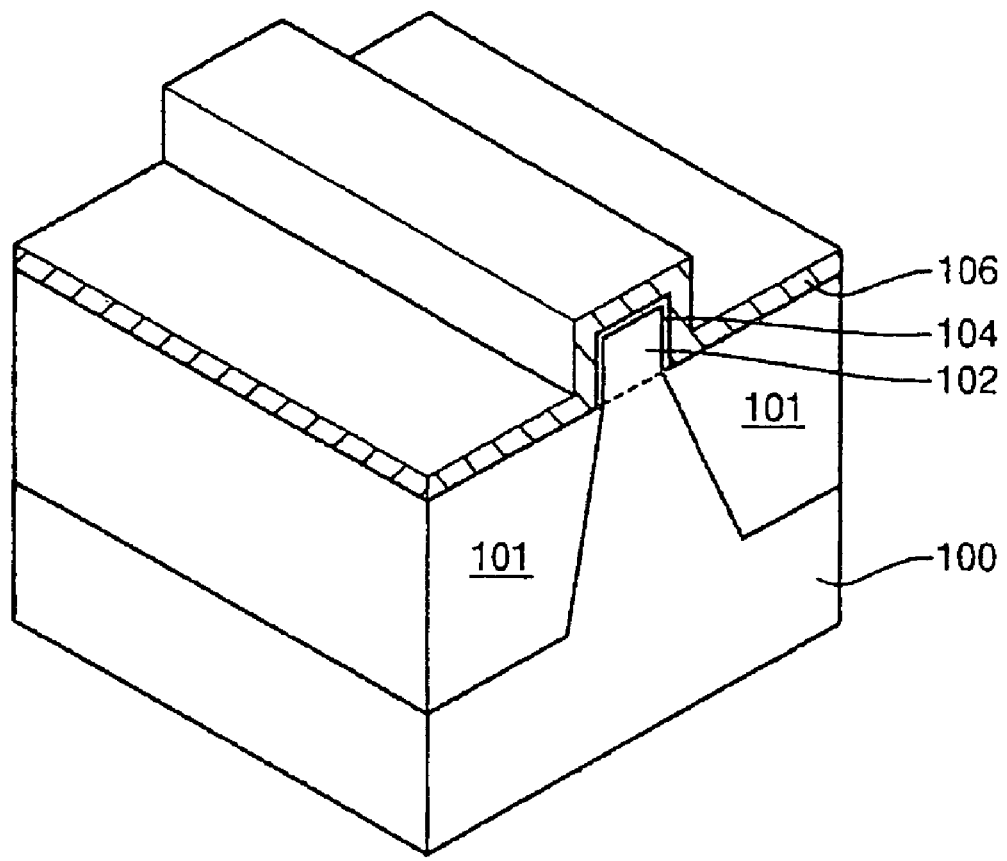

Referring to FIG. 5, a first electrode layer 106 may be formed on the gate insulating layer pattern 104. In example embodiments, the first electrode layer 106 may have a thickness of about 100 Å to about 400 Å, for example, about 300 Å. Because the first electrode layer 106 may be relatively thin, the first electrode layer 106 may be formed along a profile of the active fin 102. In example embodiments, the first electrode layer 106 may include polysilicon germanium. Alternatively, the first electrode layer 106 may include titanium, titanium nitride, tantalum and/or tantalum nitride. These may be used alone or in a combination thereof. A process for forming the first electrode layer 106 using the polysilicon germanium may be explained in detail.

A silicon seed layer (not shown) may be formed on the gate insulating layer pattern 104 and the isolation layer patterns 101. The silicon seed layer may include polysilicon and/or amorphous silicon. Further, the silicon seed layer may have a thickness of no more than about 30 Å. Furthermore, the silicon seed layer may be formed by a low pressure chemical vapor deposition (LPCVD) process. The silicon seed layer may serve as a seed for forming a polysilicon germanium layer by a subsequent process.

The polysilicon germanium layer may be formed on the silicon seed layer by an LPCVD process using a silicon source gas and a germanium source gas. For example, the silicon source gas may include $SiH_4$. The germanium source gas may include $GeH_4$. A carrier gas may include $H_2$. Further, the LPCVD process may be performed under a pressure of about 10 mTorr to about 100 mTorr at a temperature of about 500° C. to about 600° C. An atom concentration of silicon and germanium in the silicon germanium layer may be adjusted by controlling flow rates of the silicon source gas and the germanium source gas. In contrast, the first electrode layer 106 may include titanium nitride. For example, the first electrode layer 106 may be formed by a chemical vapor deposition (CVD) process and/or an atomic layer deposition (ALD) process, which may use a titanium source gas including $TiCl_4$ and a nitrogen source gas including $NH_3$.

Figure 6:
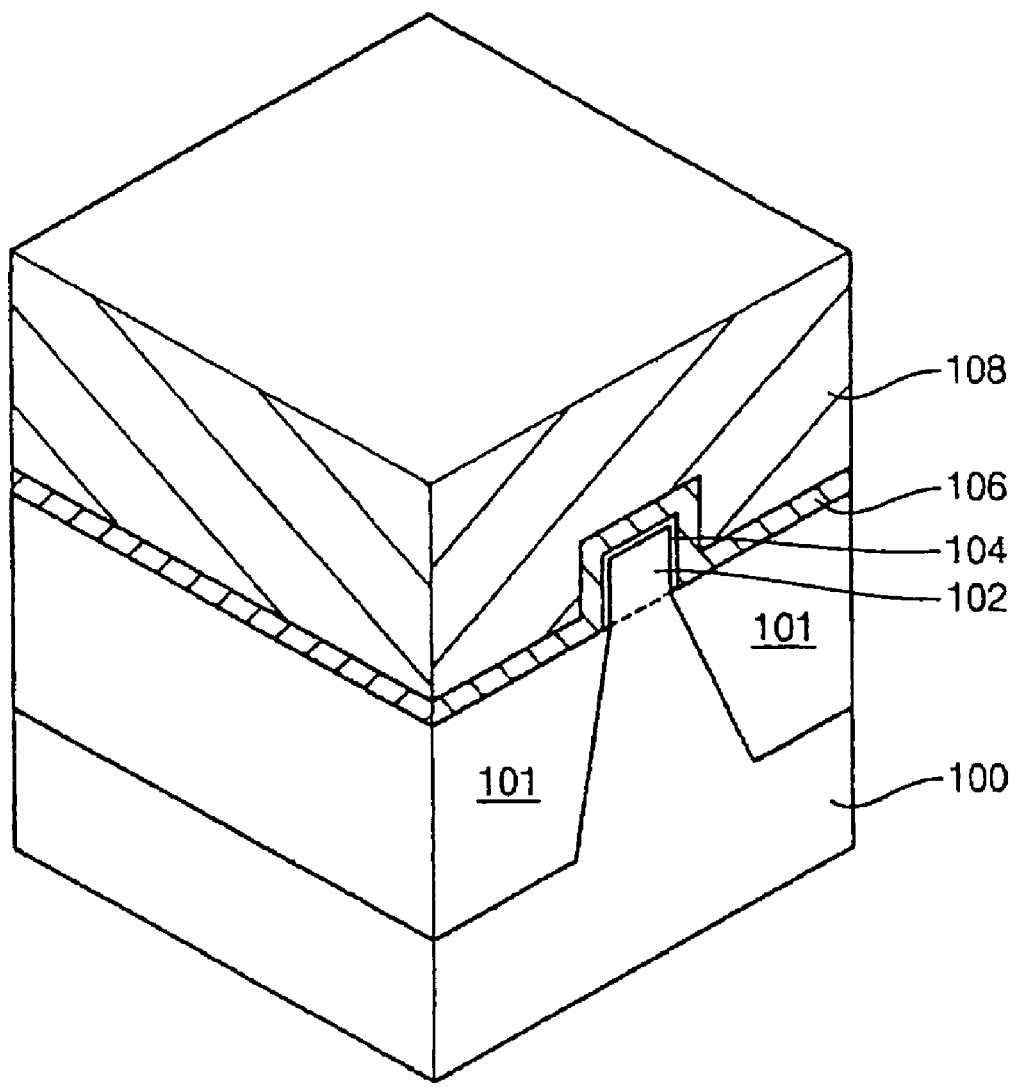

Referring to FIG. 6, a second electrode layer 108 may be formed on the first electrode layer 106. In example embodiments, the second electrode layer 108 may have an etching selectivity different from that of the first electrode layer 106. The second electrode layer 108 may be converted into an electrode pattern for reducing a resistance of a gate electrode by a following process. Thus, to sufficiently reduce the resistance of the gate electrode, the second electrode layer 108 may be relatively thick. In example embodiments, the second electrode layer 108 may have an upper surface higher than that of the active fin 102.

Further, the second electrode layer 108 may include a material having stronger adhesion strength with respect to the first electrode layer 106. Further, the second electrode layer 108 may include a material that may be readily etched using an etching gas. In example embodiments, the second electrode layer 108 may include polysilicon. Alternatively, the second electrode layer 108 may include a metal that may be etched by a dry etching process. For example, the second electrode layer 108 may include tungsten. In example embodiments, an ohmic layer (not shown) and a metal barrier layer (not shown) may be formed between the first electrode layer 106 and the second electrode layer 108.

Although not depicted in the drawings, when the second electrode layer 108 includes polysilicon, a metal layer (not shown) or a metal silicide layer (not shown) may be further formed on the polysilicon layer to reduce the resistance of the gate electrode. After forming the second electrode layer 108, a polishing process may be performed on the second electrode layer 108 to planarize an upper surface of the second electrode layer 108.

Further, impurities may be implanted into the first electrode layer 106 and the second electrode layer 108. In example embodiments, the impurities may have a conductive type substantially the same as that of impurities in source/drain regions. For example, when the first electrode layer 106 includes polysilicon germanium, the FinFET may have a proper work function, which may provide a desired threshold voltage, by doping the impurities.

Figure 7:
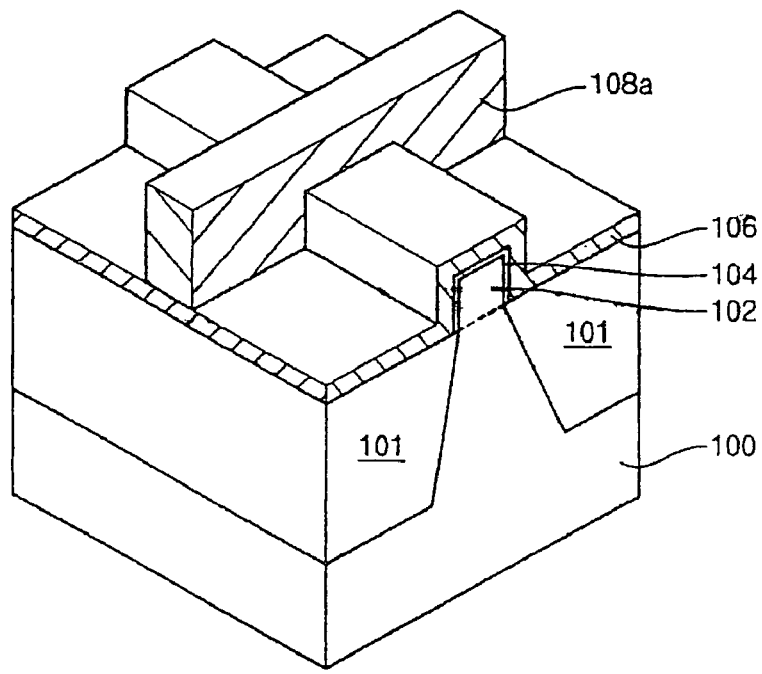

Referring to FIG. 7, a mask pattern (not shown) may be formed on the second electrode layer 108 to cover a region of the second electrode layer 108 where the gate electrode may be formed. In example embodiments, the mask pattern may include a photoresist pattern and/or a hard mask pattern. Further, the mask pattern may have a linear shape extending in a direction substantially perpendicular to an extending direction of the active fin 102. The second electrode layer 108 may be etched using the mask pattern as an etch mask to form a second electrode pattern 108a. In example embodiments, the second electrode layer 108 may be etched by a dry etching process.

Figure 8:
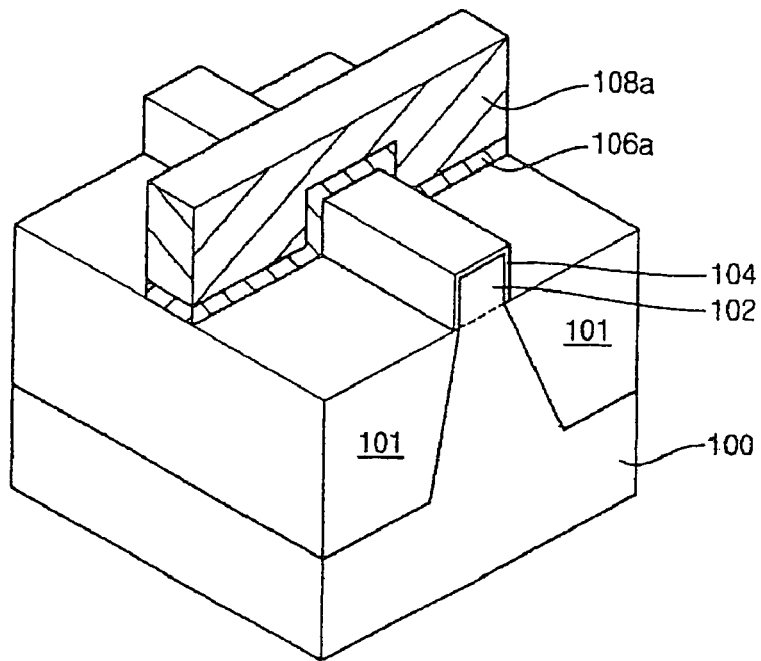

Referring to FIG. 8, the first electrode layer 106 exposed by the second electrode pattern 108a may be etched to form a first preliminary electrode pattern 106a. When the first electrode layer 106 includes polysilicon or metal having a mid-gap work function, the first electrode layer 106 may not be readily etched. For example, a relatively long time for etching the first electrode layer 106 may be required including the above-mentioned material by a dry etching process. Further, the active fin 102 may be damaged by performing the dry etching process. Thus, the first electrode layer 106 may be etched by a wet etching process.

In example embodiments, when the first electrode layer 106 includes polysilicon germanium, a wet etching process using an etching solution which includes nitric acid, fluoric acid, acetic acid and deionized water may be performed on the first electrode layer 106 to form the first preliminary electrode pattern 106a. Alternatively, when the first electrode layer 106 includes titanium nitride, a wet etching process using sulfuric acid may be performed on the first electrode layer 106 to form the first preliminary electrode pattern 106a.

As shown in the drawings, the first preliminary electrode pattern 106a and the second electrode pattern 108a may have a linear shape extending in a direction substantially perpendicular to an extending direction of the active fin 102. Further, the gate insulating layer pattern 104 may be exposed by the first preliminary electrode pattern 106a and the second electrode pattern 108a.

Figure 9:
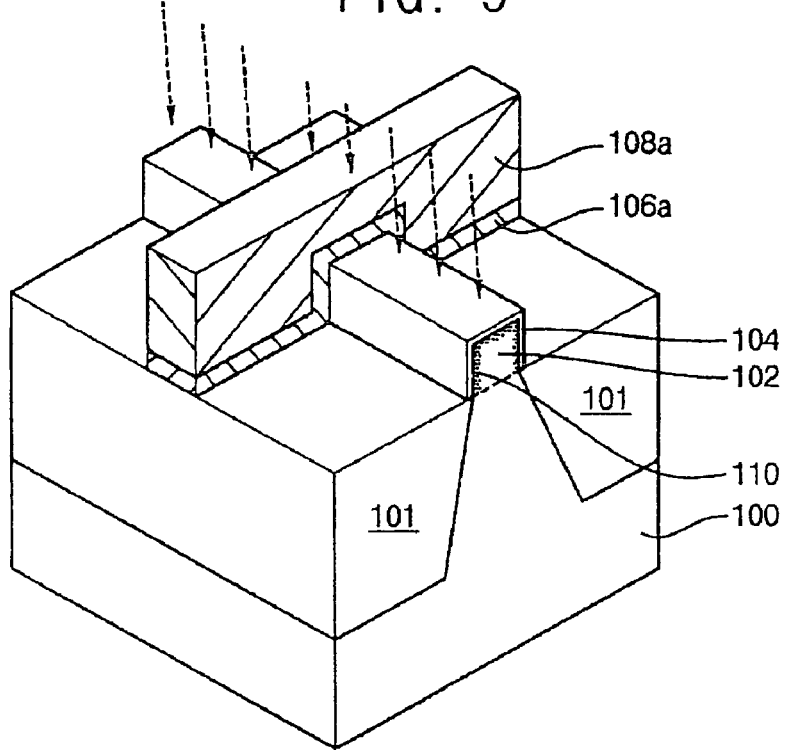
Figure 12:
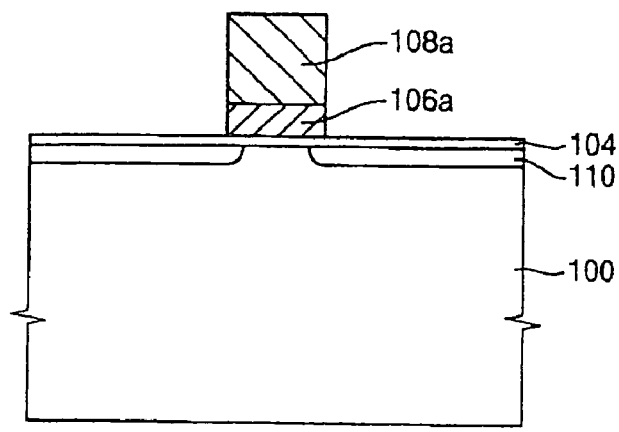

Referring to FIGS. 9 and 12, impurities may be implanted into a surface of the active fin 102 on both sides of the first preliminary electrode pattern 106a and the second electrode pattern 108a to form source/drain expansion regions 110. In example embodiments, the impurity implantation process may include a tilted angle implantation process and/or a plasma ion doping process.

The plasma ion doping process may include generating a plasma sheath on the semiconductor substrate 100, and applying a voltage between an anode and a cathode on which the semiconductor substrate 100 is placed. The impurities may cross the plasma sheath and then penetrate into the semiconductor substrate 100. According to the plasma ion doping process, the source/drain expansion regions 110 having a shallow and uniform doping depth may be formed in the surface of the active fin 102.

After implanting the impurities into the semiconductor substrate 100, performing an activation process for activating the impurities may be required. The activation process may include thermally treating the semiconductor substrate 100. Further, the activation process may be performed by an additional thermal treatment process. Alternatively, the activation process may be performed together with other processes where a thermal treatment may be carried out. The impurities in the source/drain expansion regions 110 may diffuse in a lateral direction during the activation process, so that an area between the source/drain expansion regions 110 and the first preliminary electrode pattern 106a overlaps.

According to a conventional method, in order to reduce the overlapped area between a gate electrode and impurity regions, an offset spacer (not shown) may be formed on a sidewall of the gate electrode before implanting impurities. However, the offset spacer may be formed on a sidewall of an active fin as well as the sidewall of the gate electrode. Thus, because the impurities may penetrate into the active fin through the offset spacer and a gate insulating layer pattern, increased energy to dope the sidewall of the active fin with the impurities may be required. Further, although the ion implantation process is accomplished, the impurity may not be uniformly distributed in the upper surface and the sidewall of the active fin.

In contrast, the method of example embodiments may not include a process for forming the offset spacer before forming the source/drain expansion regions 110. Therefore, the active fin 102 on which the gate insulating layer pattern 104 having a uniform thickness is formed may be exposed by the first preliminary electrode pattern 106a and the second electrode pattern 108a, so that the source/drain expansion regions 110 in the surface of the active fin 102 may have a uniform doping depth. Further, the method of example embodiments may include simple processes because the complicated process for forming the offset spacer may not be performed.

Figure 10:
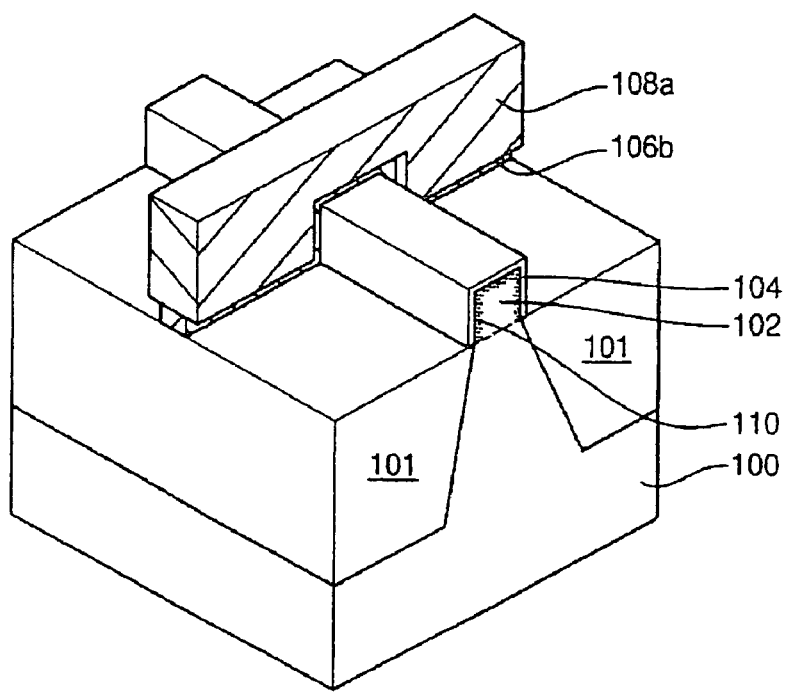
Figure 13:
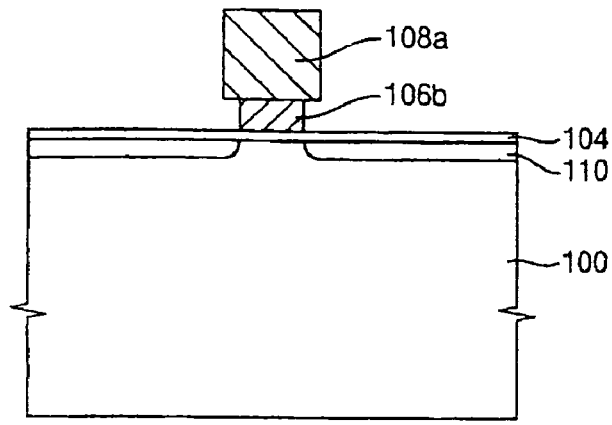

When the impurity implantation process is performed, the first preliminary electrode pattern 106a and the second electrode pattern 108a may be doped with impurities having a conductive type substantially the same as that of the impurities in the source/drain expansion regions 110. Referring to FIGS. 10 and 13, a sidewall of the first preliminary electrode pattern 106a may be partially removed to form a first electrode pattern 106b having a width less than that of the second electrode pattern 108a.

The source/drain expansion regions 110 may be formed without performing the process for forming the offset spacer on the sidewall of the first preliminary electrode pattern 106a, so that the source/drain expansion regions 110 may extend under the first preliminary electrode pattern 106a. Thus, an overlapped area between the first preliminary electrode pattern 106a and the source/drain expansion regions 110 may be larger. Therefore, the overlapped area between the first preliminary electrode pattern 106a and the source/drain regions 110 may be reduced by partially removing the sidewall of the first preliminary electrode pattern 106a.

However, when the first electrode pattern 106b is not overlapped with the source/drain expansion regions 110 by etching the first preliminary electrode pattern 106a, the FinFET may have a relatively low driving current and undesirable switching characteristics. Thus, overlapping the first electrode pattern 106b with the source/drain expansion regions 110 or contacting the first electrode pattern 106 with the source/drain expansion regions 110 may be necessary. In example embodiments, the sidewall of the first preliminary electrode pattern 106a may be removed by a wet etching process.

For example, when the first preliminary electrode layer 106a includes polysilicon germanium, a wet etching process using an etching solution, which includes ammonium hydroxide, hydrogen peroxide and deionized water or nitric acid, fluoric acid, acetic acid and deionized water, may be performed on the first preliminary electrode layer 106a to form the first electrode pattern 106b. The etching solution including ammonium hydroxide, hydrogen peroxide and deionized water may etch the polysilicon germanium at a slower speed of about 20 Å/min. Therefore, the wet etching process may be controlled so as to remove a relatively thin portion of the first preliminary electrode layer 106a. Alternatively, when the first preliminary electrode layer 106a includes titanium nitride, a wet etching process using an etching solution, which includes sulfuric acid, may be performed on the first preliminary electrode pattern 106a to form the first electrode pattern 106b.

Figure 11:
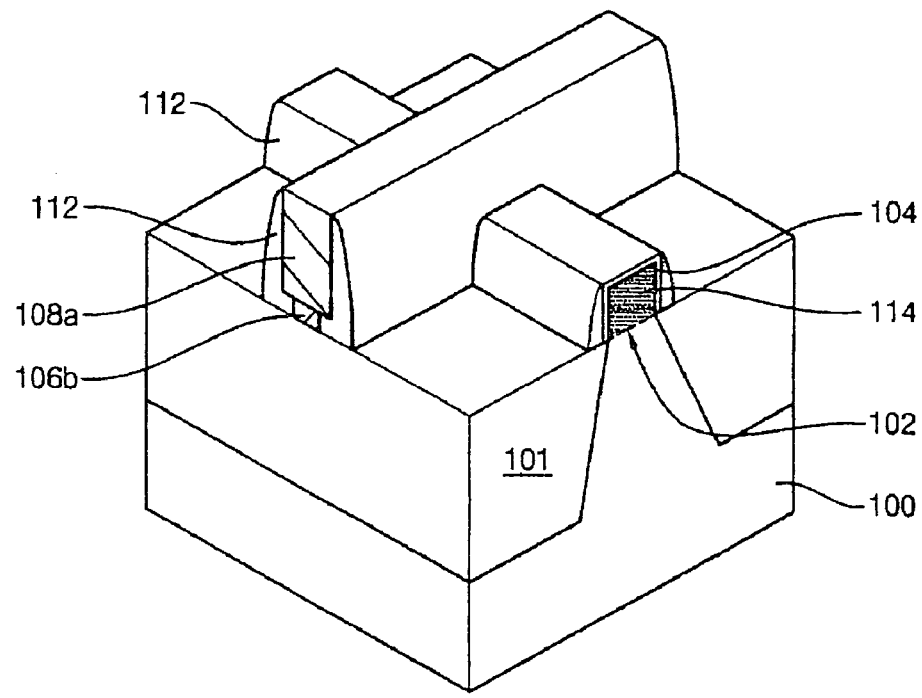

Referring to FIG. 11, an insulating layer (not shown) may be formed on profiles of the first electrode pattern 106b, the second electrode pattern 108a and the gate insulating layer pattern 104. In example embodiments, the insulating layer may include silicon nitride formed by an LPCVD process. The insulating layer may be anisotropically etched to form spacers 112 on sidewalls of the first electrode pattern 106b and the second electrode pattern 108a. Further, the spacers 112 may be formed on the sidewall of the active fin 102.

Impurities may be implanted into the semiconductor substrate 100 having the spacers 112 to form source/drain regions 114 (See FIG. 2). In example embodiments, the source/drain regions 114 may have an impurity concentration higher than that of the source/drain expansion regions 110. According to example embodiments, the FinFET may have a reduced overlapped area between the gate electrode and the drain region. Thus, the GIDL current may be decreased. Further, the FinFET may include the source/drain expansion regions having a uniform and shallow junction depth, so that the FinFET may have improved operational characteristics.

Figure 14:
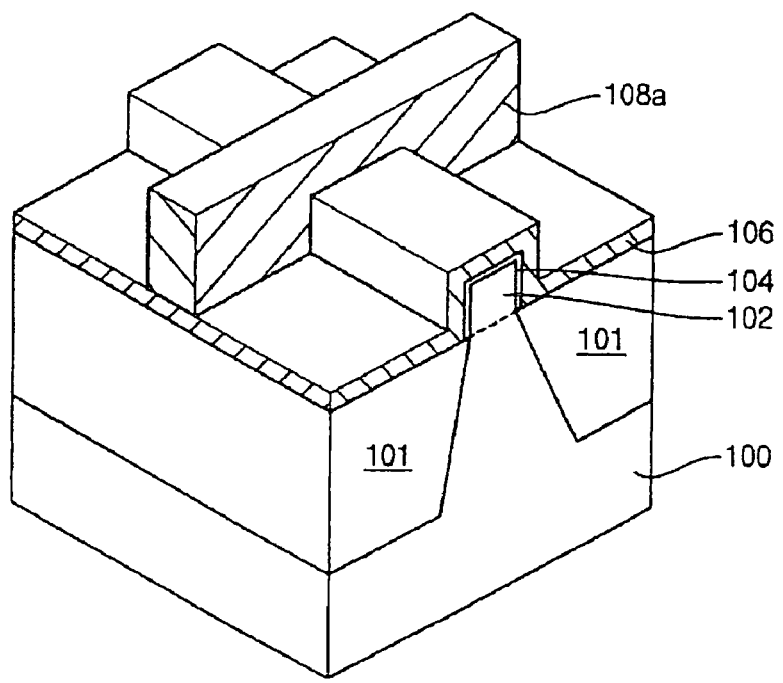
Figure 15:
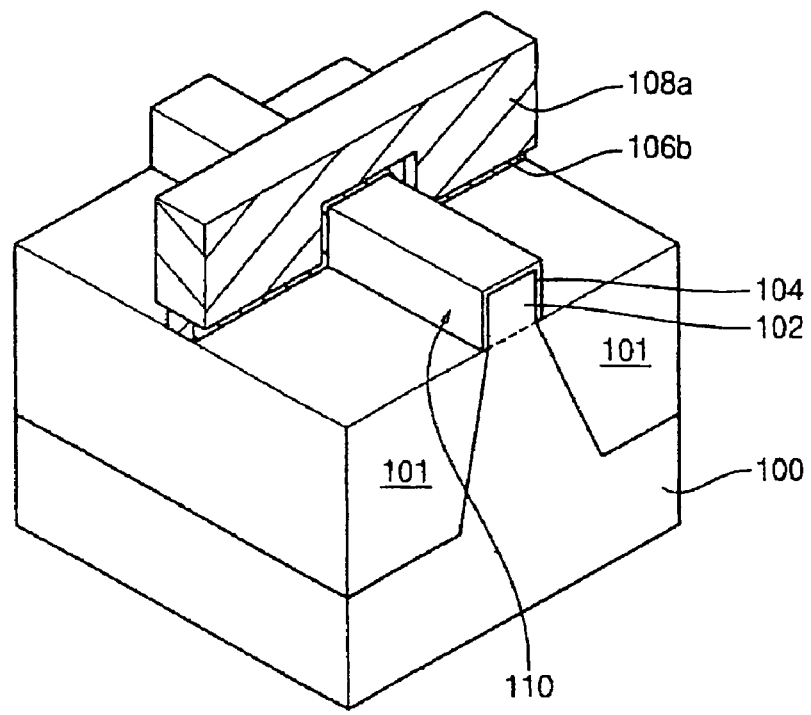
Figure 16:
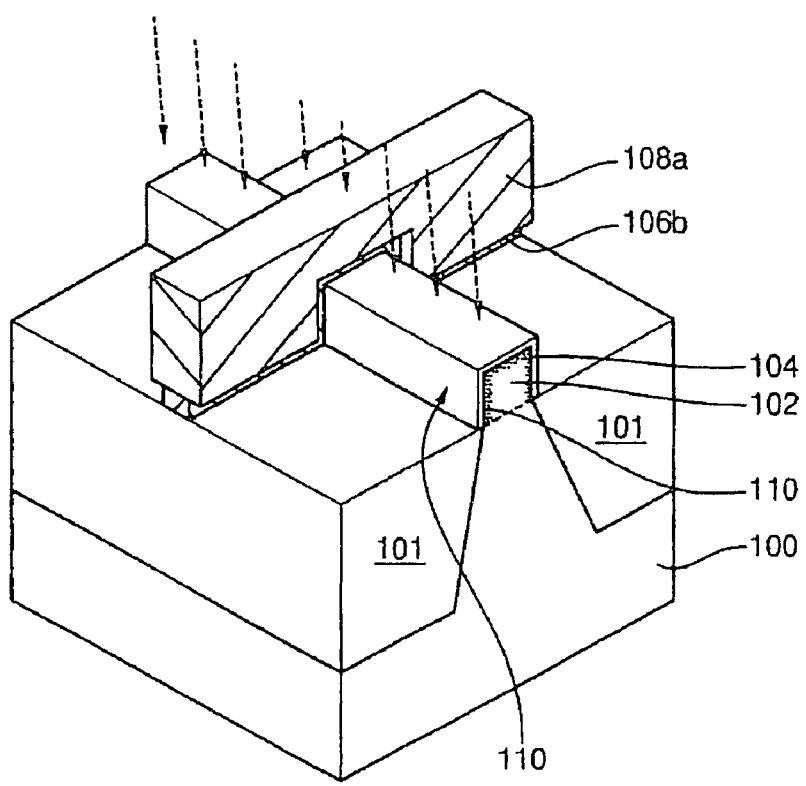

FIGS. 14 to 16 are perspective views and cross-sectional views illustrating a method of manufacturing the FinFET in FIGS. 1 and 2 in accordance with example embodiments. A method of example embodiments may include processes substantially the same as those illustrated with reference to FIGS. 3 to 13 except for a process sequence of the first electrode pattern and the source/drain expansion regions. Processes substantially the same as those illustrated with reference to FIGS. 3 to 6 may be performed to form the gate insulating layer pattern 104, the first electrode layer 106 and the second electrode layer 108 on the active fin 102.

Referring to FIG. 14, a mask pattern (not shown) may be formed on the second electrode layer 108 to cover a region of the second electrode layer 108 where a gate electrode may be formed. In example embodiments, the mask pattern may include a photoresist pattern and/or a hard mask pattern. Further, the mask pattern may have a linear shape extending in a direction substantially perpendicular to an extending direction of the active fin 102. The second electrode layer 108 may be dry-etched using the mask pattern to form the second electrode pattern 108a. In example embodiments, the second electrode layer 108 may be anisotropically etched by a dry etching process.

Referring to FIG. 15, the first electrode layer 106 exposed by the second electrode pattern 108a may be wet-etched to form the first electrode layer pattern 106b having a width less than that of the second electrode pattern 108a. By the wet etching process, a portion of the first electrode layer 106 exposed by the second electrode pattern 108a may be initially etched. A sidewall of the first electrode layer 106 may then be etched to form the first electrode pattern 106b having the width less than that of the second electrode pattern 108a.

In example embodiments, when the first electrode layer 106 includes polysilicon germanium, an etching solution for etching the first electrode layer 106 may include nitric acid, fluoric acid, acetic acid and deionized water or ammonium hydroxide, hydrogen peroxide and deionized water. Alternatively, when the first electrode layer 106 includes titanium nitride, an etching solution for etching the first electrode layer 106 may include sulfuric acid.

Referring to FIG. 16, impurities may be implanted into the semiconductor substrate 100 having the first electrode pattern 106b and the second electrode pattern 108a to form source/drain expansion regions 110 in a surface of the active fin 102. In example embodiments, the impurity implantation process may include a tilted angle implantation process and/or a plasma ion doping process. The second electrode pattern 108a may serve as an ion implantation mask in the impurity implantation process. Thus, the surface of the semiconductor substrate 100 on both sides of the second electrode pattern 108a may be mainly doped with the impurities. As a result, although the impurities may diffuse, an overlapped area between the first electrode pattern 106b and the source/drain expansion regions 110 may not be significantly increased.

Although not depicted in the drawings, after forming the source/drain expansion regions 110, a process for partially removing a sidewall of the first electrode pattern 106b may be additionally performed to further reduce the overlapped area between the first electrode pattern 106b and the source/drain expansion regions 110. Processes substantially the same as those illustrated with reference to FIG. 11 may be performed to complete the FinFET. For example, the spacers may be formed on sidewalls of the first electrode pattern 106b, the second electrode pattern 108a and the active fin 102. Impurities may be implanted into the semiconductor substrate 100 to form source/drain regions. According to example embodiments, the first electrode pattern may be formed by one wet etching process. Thus, the FinFET may be manufactured by the simple method.

Figure 17:
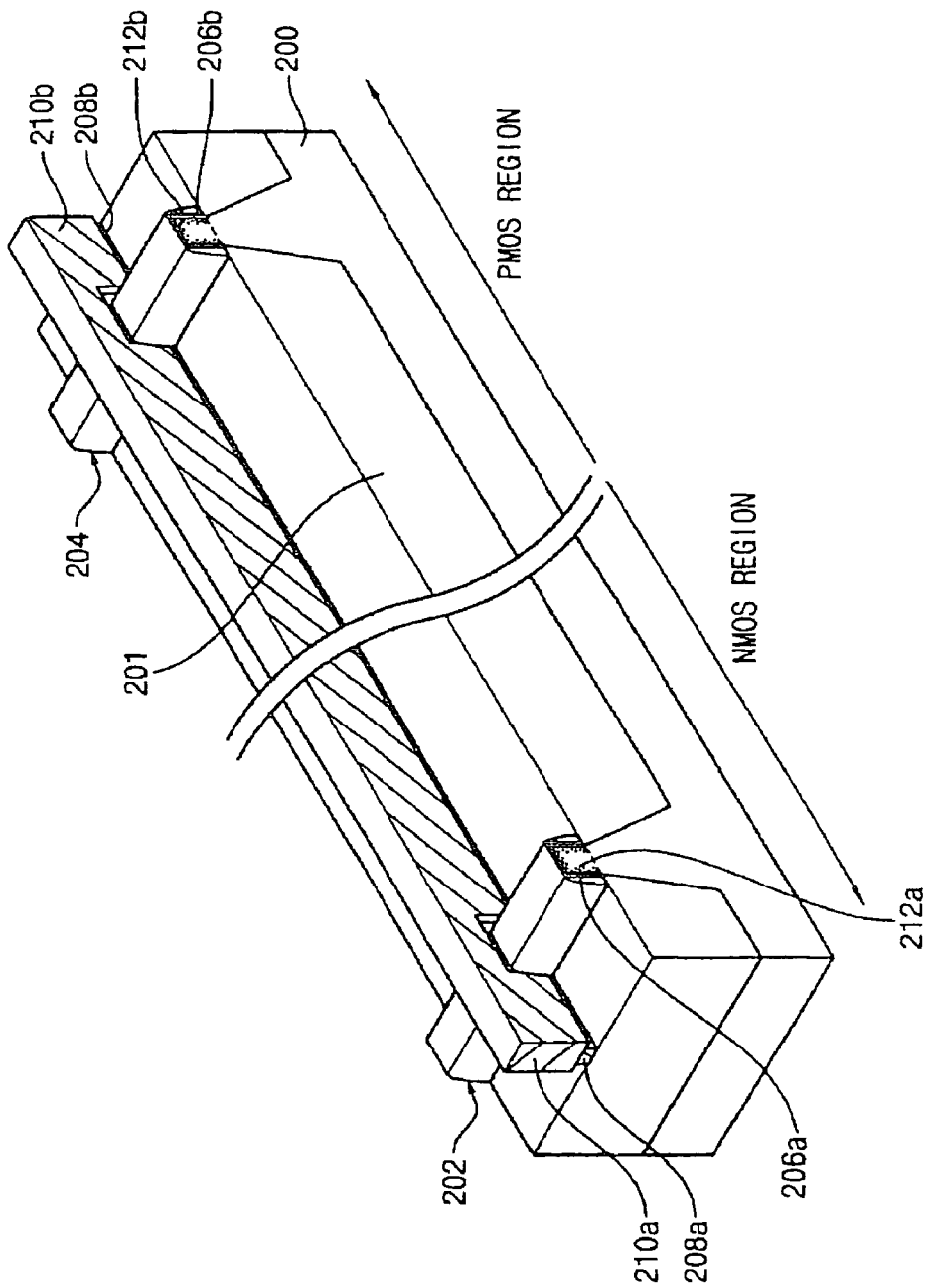

FIG. 17 is a perspective view illustrating a CMOS FinFET in accordance with example embodiments. Referring to FIG. 17, a semiconductor substrate 200 having an NMOS region and a PMOS region may be prepared. A first active fin 202 may be formed in the NMOS region of the semiconductor substrate 200. A second active fin 204 may be formed in the PMOS region of the semiconductor substrate 200. Isolation layer patterns 201 may be arranged on both sides of the first active fin 202 and the second active fin 204. Further, the isolation layer patterns 201 may have an upper surface lower than that of the first active fin 202 and the second active fin 204. Thus, the first active fin 202 and the second active fin 204 may protrude from the isolation layer patterns 201.

A first gate insulating layer pattern 206a may be formed on a surface of the first active fin 202. A second gate insulating layer pattern 206b may be formed on a surface of the second active fin 204. In example embodiments, the first gate insulating layer pattern 206a and the second gate insulating layer pattern 206b may include silicon oxide formed by a thermal oxidation process.

A first electrode pattern 208a may be formed on the first gate insulating layer pattern 206a. The first electrode pattern 208a may be intersected with the first active fin 202. Further, the first electrode pattern 208a may have a first work function. In example embodiments, the first electrode pattern 208a may include polysilicon germanium doped with n-type impurities. Alternatively, the first electrode pattern 208a may include titanium, titanium nitride, tantalum and/or tantalum nitride having a mid-gap work function. These may be used alone or in a combination thereof.

A second electrode pattern 210a may be formed on the first electrode pattern 208a. The second electrode pattern 210a may have a width greater than that of the first electrode pattern 208a. Further, the second electrode pattern 210a may include a material having an etching selectivity different from that of a material in the first electrode pattern 208a. First source/drain expansion regions 212a including n-type impurities may be formed in the surface of the first active fin 202 on both sides of the first electrode pattern 208a. The first source/drain expansion regions 212a may be partially overlapped with the first electrode pattern 208a.

A third electrode pattern 208b may be formed on the second oxide layer pattern 206b. The third electrode pattern 208b may be intersected with the second active fin 204. In example embodiments, the third electrode pattern 208b may include a material substantially the same as that of the first electrode pattern 208a. Further, the third electrode pattern 208b may have a second work function higher than or substantially equal to the first work function of the first electrode pattern 208a. For example, when the first electrode pattern 208a includes polysilicon germanium doped with n-type impurities, the third electrode pattern 208b may include polysilicon germanium doped with p-type impurities. In example embodiments, the second work function of the third electrode pattern 208b may be higher than the first work function of the first, electrode pattern 208a.

In contrast, the first electrode pattern 208a and the third electrode pattern 208b may include titanium, titanium nitride, tantalum and/or tantalum nitride having a mid-gap work function. These may be used alone or in a combination thereof. In example embodiments, the first electrode pattern 208a and the second electrode pattern 208b may have a work function of about 4.0 eV to about 5.2 eV.

A fourth electrode pattern 210b may be formed on the third electrode pattern 208b. In example embodiments, the fourth electrode pattern 210b may have a width greater than that of the third electrode pattern 208b. Further, the fourth electrode pattern 210b may have a material substantially the same as that of the second electrode pattern 210a. Second source/drain expansion regions 212b including p-type impurities may be formed in the surface of the second active fin 204 on both sides of the third electrode pattern 208b. The second source/drain expansion regions 212b may be partially overlapped with the third electrode pattern 208b.

Although not depicted in the drawings, spacers may be arranged on both sides of the first electrode pattern 208a, the second electrode pattern 210a, the third electrode pattern 208b and the fourth electrode pattern 210b. Further, first source/drain regions and second source/drain regions may be formed in surfaces of the active fins on both sides of the spacers. The CMOS FinFET in FIG. 17 may be manufactured by any one of the above-mentioned methods.

In a method of manufacturing the CMOS FinFET, with reference to FIG. 17, a semiconductor substrate 200 having an NMOS region and a PMOS region may be prepared. A first active fin 202 may be formed in the NMOS region of the semiconductor substrate 200. A second active fin 204 may be formed in the PMOS region of the semiconductor substrate 200. A first gate insulating layer pattern 206a may be formed on a surface of the first active fin 202. A second gate insulating layer pattern 206b may be formed on a surface of the second active fin 204. A first gate layer and a second gate layer may be sequentially formed on the first gate insulating layer pattern 206a and the second oxide layer pattern 206b. The first electrode layer and the second electrode layer may be patterned to form a first preliminary electrode pattern, a second electrode pattern 210a, a third preliminary electrode pattern and a fourth electrode pattern 210b. The first preliminary electrode pattern may be intersected with the first active fin 202.

Further, the third preliminary electrode pattern may be intersected with the second active fin 204. N-type impurities may be implanted into the surface of the first active fin 202 exposed by the first preliminary electrode pattern and the second electrode pattern 210a to form first source/drain expansion regions 212a. P-type impurities may be implanted into the surface of the second active fin 204 exposed by the third preliminary electrode pattern and the fourth electrode pattern 210b to form second source/drain expansion regions 212b. Sidewalls of the first preliminary electrode pattern and the third preliminary electrode pattern may be partially removed to form a first electrode pattern 208a and a third electrode pattern 208b.

Spacers (not shown) may be formed on sidewalls of the first electrode pattern 208a, the second electrode pattern 210a, the third electrode pattern 208b and the fourth electrode pattern 210b. N-type impurities may be selectively implanted into the surface of the first active fin 202 on both sides of the spacers to form first source/drain regions (not shown). Further, p-type impurities may be selectively implanted into the surface of the second active fin 204 on both sides of the spacers to form second source/drain regions (not shown).

According to example embodiments, the transistor may be used in a semiconductor device requiring an increased integration degree. For example, example embodiments may be used as a cell transistor of a memory device, e.g., a DRAM or a switching transistor of a logic device. Further, example embodiments may be used a semiconductor device requiring a high-capacitated transistor due to the reduced GIDL current.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific example embodiments disclosed, and that modifications to disclosed example embodiments, as well as other example embodiments, are intended to be included within the scope of the appended claims. Example embodiments are defined by the following claims, with equivalents of the claims to be included therein.

What is claimed is:

1. A method of manufacturing a fin field effect transistor (FinFET), the method comprising:
    forming at least one active fin on a substrate;
    forming a gate insulating layer pattern on a surface of the at least one active fin;
    sequentially forming a first electrode layer and a second electrode layer on the gate insulating layer pattern;
    patterning the first electrode layer and the second electrode layer to form a first preliminary electrode pattern and a second electrode pattern, the first preliminary electrode pattern being intersected with the at least one active fin;
    doping the surface of the at least one active fin exposed by the first preliminary electrode pattern and the second electrode pattern to form at least one pair of source/drain expansion regions; and
    partially removing a sidewall of the first preliminary electrode pattern to form a first electrode pattern having a width less than that of the second electrode pattern.

2. The method of claim 1, wherein the first electrode pattern and the second electrode pattern include materials having different etching selectivities.

3. The method of claim 1, wherein the first electrode pattern includes polysilicon germanium, and the second electrode pattern includes polysilicon.

4. The method of claim 3, wherein patterning the first electrode layer and the second electrode layer comprises:
    forming a mask pattern on the second electrode layer;
    dry-etching the second electrode layer using the mask pattern to form the second electrode pattern; and
    wet-etching the first electrode layer under the second electrode pattern to form the first preliminary electrode pattern.

5. The method of claim 4, wherein the first electrode layer is wet-etched using an etching solution including nitric acid, fluoric acid, acetic acid and deionized water.

6. The method of claim 3, wherein the sidewall of the first preliminary electrode pattern is partially removed by a wet etching process using an etching solution that includes ammonium hydroxide, hydrogen peroxide and deionized water or nitric acid, fluoric acid, acetic acid and deionized water.

7. The method of claim 1, wherein the first electrode layer includes at least one selected from the group consisting of titanium, titanium nitride, tantalum and tantalum nitride, and the second electrode layer includes polysilicon.

8. The method of claim 1, wherein forming the first electrode pattern includes partially removing the first preliminary electrode pattern to overlap the first electrode pattern with the source/drain expansion regions.

9. The method of claim 1, wherein the source/drain expansion regions are formed by a plasma ion implantation process or tilted angle ion implantation process.

10. The method of claim 1, further comprising:
forming spacers on sidewalls of the first electrode pattern and the second electrode pattern; and
doping the surface of the active fin on both sides of the spacers with impurities to form source/drain regions.

11. The method of claim 10, wherein the source/drain regions are formed by a plasma ion implantation process or tilted angle ion implantation process.

12. The method of claim 1, wherein the substrate includes a single crystalline silicon substrate, a silicon-on-insulator (SOI) substrate, a silicon germanium-on-insulator (SGOI) substrate or a germanium-on-insulator (GOI) substrate.

13. A method of manufacturing a fin field effect transistor (FinFET), the method comprising:
forming an active fin protruded from a substrate;
forming a gate insulating layer pattern on a surface of the active fin;
sequentially forming a first electrode layer and a second electrode layer on the gate insulating layer pattern;
patterning the second electrode layer to form a second electrode pattern, the second electrode pattern being intersected with the active fin;
etching the first electrode layer exposed by the second electrode pattern to form a first preliminary electrode pattern;
partially removing a sidewall of the first preliminary electrode pattern to form a first electrode pattern having a width less than that of the second electrode pattern; and
doping the surface of the active fin exposed by the first electrode pattern and the second electrode pattern to form source/drain expansion regions.

14. The method of claim 13, wherein the first preliminary electrode pattern and the first electrode pattern are formed by substantially the same wet etching process.

15. The method of claim 13, further comprising:
partially removing a sidewall of the first electrode pattern to reduce an overlapped area between the first electrode pattern and the source/drain expansion regions, after forming the source/drain expansion regions.

16. A method of manufacturing a fin field effect transistor (FinFET), the method comprising:
forming a first active fin in an NMOS region of a substrate;
forming a second active fin in a PMOS region of the substrate;
forming a gate insulating layer pattern on the first active pin and the second active pin;
sequentially forming a first electrode layer and a second electrode layer on the gate insulating layer pattern;
patterning the first electrode layer and the second electrode layer to form a first preliminary electrode pattern, a second electrode pattern, a third preliminary electrode pattern and a fourth electrode pattern, the first preliminary electrode pattern being intersected with the first active pin and the third preliminary electrode pattern being intersected with the second active fin;
doping the surface of the first active fin exposed by the first preliminary electrode pattern and the second electrode pattern with n-type impurities to form first source/drain expansion regions;
doping the surface of the second active fin exposed by the third preliminary electrode pattern and the fourth electrode pattern with p-type impurities to form second source/drain expansion regions; and
partially removing sidewalls of the first preliminary electrode pattern and the third preliminary electrode pattern to form a first electrode pattern and a third electrode pattern.

* * * * *